United States Patent
Cline et al.

(10) Patent No.: US 9,768,159 B2
(45) Date of Patent: Sep. 19, 2017

(54) ELECTROSTATIC DISCHARGE PROTECTION DEVICE FOR HIGH VOLTAGE

(71) Applicant: Texas Instruments Incorporated, Dallas, TX (US)

(72) Inventors: Roger A. Cline, Plano, TX (US); Kyle C. Schulmeyer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/829,898

(22) Filed: Aug. 19, 2015

(65) Prior Publication Data
US 2017/0053905 A1    Feb. 23, 2017

(51) Int. Cl.
*H01L 27/00* (2006.01)
*H01L 27/02* (2006.01)

(52) U.S. Cl.
CPC ...... *H01L 27/0292* (2013.01); *H01L 27/0255* (2013.01); *H01L 27/0262* (2013.01); *H01L 27/0266* (2013.01)

(58) Field of Classification Search
CPC ....... H01L 29/00; H01L 29/45; H01L 29/417; H01L 27/00; H01L 27/0266; H01L 27/0255; H01L 27/0251; H01L 27/0262; H01L 27/0259; H01L 27/0629; H01L 27/0248; H01L 27/0292
USPC ................................ 257/355, 356, 360, 361
See application file for complete search history.

(56) References Cited

U.S. PATENT DOCUMENTS 6,858,902 B1 *  2/2005  Salling .................. H01L 27/027
                                                257/355

* cited by examiner

*Primary Examiner* — Chuong A Luu
(74) *Attorney, Agent, or Firm* — Jacqueline J. Garner; Charles A. Brill; Frank D. Cimino

(57) ABSTRACT

A circuit for protecting against electrostatic discharge events has a semiconductor substrate (200) of first conductivity embedding a first diode in a well (260) of opposite second conductivity, the diode's anode (111) tied to an I/O pin-to-be-protected (101) at a first voltage, and the first diode's cathode (112) connected to the first drain (123) of a first MOS transistor in the substrate. The first MOS transistor's first gate (122) is biased to a second voltage smaller than the first voltage, thereby reducing the first voltage by the amount of the second voltage. In series with the first MOS transistor is a second MOS transistor with its second drain (670) merged with the first source of the first MOS transistor, and its second source (131), together with its second gate (132), tied to ground potential (140).

14 Claims, 6 Drawing Sheets

ELECTROSTATIC DISCHARGE PROTECTION DEVICE FOR HIGH VOLTAGE

FIELD

Embodiments of the invention are related in general to the field of semiconductor devices and processes, and more specifically to the structure, layout and fabrication method of diode-isolated cascoded MOS electrostatic discharge protection devices.

DESCRIPTION OF RELATED ART

Integrated circuits (ICs) may be severely damaged by electrostatic discharge (ESD) events. A major source of ESD exposure to ICs is from the human body (described by the "Human Body Model", HBM); the discharge of the human body generates peak currents of several amperes to the IC for about 100 ns. A second source of ESD is from metallic objects (described by the "Machine model", MM); it can generate transients with significantly higher rise times and current levels than the HBM ESD source. A third source is described by the "charged device model" (CDM), in which the IC itself becomes charged and discharges to ground in rise times less than 500 ps.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

One common scheme to protect an input/output (I/O) pad against ESD failure uses metal-oxide-semiconductor components, such as nMOS transistor with its drain connected to the pin to be protected and its source tied to ground, and relies on the mode of a parasitic bipolar transistor (the source acts as the emitter, the drain as the collector, and the bulk semiconductor as the base) during an ESD event to provide a low impedance current path to ground. The protection level or failure threshold can be set by varying the nMOS device width.

The current carrying capability of the device is limited by thermal effects in the avalanching collector depletion layer. A number of effects (such as the increase of intrinsic carrier concentration, a reduction of carrier mobility, a decrease in thermal conductivity, and a lowering of the potential barrier for tunnel currents) contribute to the onset of thermal runaway, the second (thermal) breakdown. The reduction of the impact ionization current is offset by the thermal generation of carriers. Second breakdown, initiated in a device under stress as a result of self-heating, is characterized by the trigger current $I_{t2}$, which is very sensitive to the device design, especially the doping profiles; it results in junction melting and in an irreversible increase in leakage currents.

Another common protection scheme used in MOS ICs employs a first diode with its cathode connected to the power ($V_{DD}$) terminal for positive ESD stress and its anode connected to the I/O pad to be protected. The diode has to be made of large area, since the on-resistance of the diode determines the effectiveness. A second diode has its anode connected to ground potential ($V_{ss}$) for negative ESD stress and its cathode to the pad.

A variant of this scheme still uses the first diode for positive ESD stress, but employs a MOS transistor in place of the second diode, with the drain of a MOS transistor tied to the pad and the source tied to ground potential; the gate is typically also connected to ground through a resistor. For negative ESD stress, the parasitic diode of the transistor, formed by the pad as cathode and $V_{ss}$ as anode, offers protection. In many devices, the semiconductor substrate is p-type so that the first diode is built in an n-well as a pn diode and the transistor is an nMOS transistor. The parasitic bipolar pnp transistor of the first diode pumps current into the substrate (base) of the parasitic transistor, triggering it as an effective npn device. The efficiency of this protection depends on the capacitance associated with the $V_{DD}$ terminal; if it were too small, the vertical pnp shuts off before the HBM event, causing premature failure in the MOS transistor.

Yet another known ESD protection scheme applies to semiconductor devices integrating RF, analog and digital circuits on the same substrate using a so-called fail-safe design, which do not allow a diode between the I/O pad and $V_{DD}$. In these ESD protection devices, the I/O pad is connected to the anode of a forward biased diode located in a well with conductivity opposite to the substrate conductivity. The diode cathode is tied to the drain of an MOS transistor formed in the substrate; source and gate of the MOS transistor are connected to ground potential, $V_{ss}$. The MOS transistor forms a parasitic bipolar npn transistor with the collector at the drain, the emitter at the source, and the base at the resistive substrate. The protection concept is sometimes referred to as diode-isolated MOS concept.

The ESD trigger current $I_{t2}$ in the diode-isolated MOS protections has typically two components, which follow different routes from the pad to ground: One current path is through the forward biased diode and the parasitic npn transistor, and the other current path through a parasitic silicon-controlled rectifier (SCR) formed by the diode anode as SCR anode, the well, the substrate, and the source of the MOS transistor as the SCR cathode. The SCR is thus formed by the vertical pnp from the n-well diode with the lateral npn of the nMOS transistor. As mentioned above, in order to achieve low diode on-resistance and sufficient substrate pumping to turn on the MOS transistor, the diode has to have a large area.

In the current-voltage characteristic of the SCR, the SCR trigger voltage $V_{trig}$ is set by the reverse junction breakdown of the drain of the MOS transistor; $V_{trig}$ must be higher than the maximum desired pin application of the I/O. The SCR holding voltage $V_{hold}$ is set by the spacing between the anode of the diode and the source of the MOS transistor. A low $V_{hold}$ allows for robust ESD protection and power dissipation.

SUMMARY

In known diode-isolated protection circuits using MOS transistors against electrostatic discharge (ESD) events at device pins, the circuits are limited to the voltage tolerance of the gate-drain region of the MOS transistor, since the gate together with the source is tied to ground potential. This limitation is in conflict with the demands of a growing market for products using high voltage devices. As an example, a drain voltage application of 5 V can exceed reliability limits with large signal swings reaching about 6 V, which make it possible for the drain voltage of the MOS transistor to see a DC level for a significant amount of time of the swing; this exposure can stress the drain-to-gate region as well as the drain-to-source region.

Applicants solved the tolerance problem of voltage overswings in diode-isolated protection circuits of pins, when they discovered a methodology to add at least one other MOS transistor in series with the original one so that bias can be applied to the gate of the additional transistor in order have the transistor turned on. As an example, in the case mentioned above, a bias of 3 V would be applied to the additional transistor. This applied voltage will divide the original voltage so that in this example any voltage overswings, which the original transistor may see, will not exceed about 2.5 V so that the drain-gate region will not see excessive levels. If needed, more than one additional MOS transistor may be added in series.

Applicants found that several boundary constraints have to be kept in mind for the success of adding one or more MOS transistors in series. Referring to the added transistor tied to the pin as the first transistor with a first source and first drain, with bias at the first gate, the first drain must have a reverse junction breakdown voltage greater than the maximum voltage applied to the pin-to-be-protected. The reverse breakdown voltage of the first drain sets the trigger voltage of the parasitic silicon-controlled-rectifier; for the above example, it may be between 7 V and 9V. Further, the trigger voltage is inversely proportional to the sum of the resistances, or in short the spacing, between the grounded source in the substrate and the diode anode in the well.

In contrast, the holding voltage of the parasitic silicon-controlled-rectifier is directly proportional to the sum of the resistances, or the spacing, between the grounded source in the substrate and the diode anode in the well. Applicants found that a compromise between these conflicting trends can be achieved when they merged the contact regions of the first source and the second drain, thus reducing the spacing, and, when necessary, increased the substrate resistivity. It is further advantageous to position the diode and the two MOS transistors in close proximity, i.e. in the minimum distance allowed by the design rules.

DETAILED DESCRIPTION OF THE PREFERRED EMBODIMENTS

Figure 1:
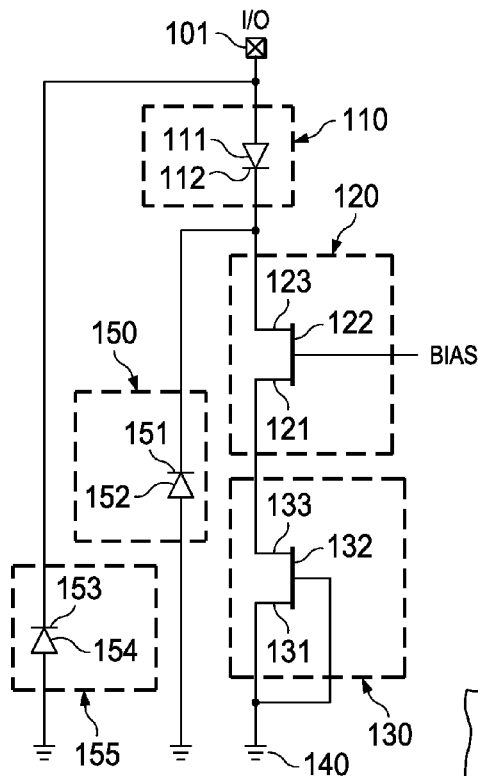
FIG. 1 shows a block diagram of an ESD protection circuit for high voltages, using a diode-isolated grounded gate MOS structure including a diode in series with a voltage divider based on MOS transistors tied in series.

FIG. 1 shows the block diagram of an embodiment of the invention. The concept referred to as the diode isolated grounded-gate MOS structure for protecting pins of a semiconductor device against ESD events includes the input/output (I/O) pin 101 to be protected in series with a forward biased diode 110 and an MOS transistor 130 to ground potential 140. Serially inserted between diode 110 and transistor 130 is another forward biased MOS transistor 120, which has a gate 122 activated by a bias from an outside voltage potential. Pin 101 is connected with the anode 111 of diode 110; the cathode 112 of the diode is tied to the drain 123 of MOS transistor 120.

MOS transistor 120 is herein referred to as first transistor, and MOS transistor 130 is referred to as second transistor. Drain 133 of second transistor 130 is tied to source 121 of first transistor 120; gate 132 and source 131 of the second transistor are connected to ground potential 140.

The semiconductor device, usually an integrated circuit (I/C), with pin 101 is embedded in a semiconductor substrate of first conductivity and first resistivity. In the examples of the following Figures, the substrate is p-type, or at least a p-type well; in other embodiments, the substrate may be n-type. The maximum voltage applied to pin 101 is referred to herein as first voltage.

The term "substrate" refers herein to the starting semiconductor wafer, which, in present manufacturing generally and also in the examples of the following Figures, typically has p-type doping. With this selection, the semiconductor substrate is a p-type substrate, the MOS transistor an nMOS transistor, the diode a pn-, and the silicon-controlled rectifier a pnpn-SCR. It should be stressed, however, that the invention and all description also cover the case where the substrate has n-type doping. Frequently, but not necessarily, an epitaxial layer of the same conductivity type as the substrate has been deposited over the substrate; in this case the term "substrate" refers to epitaxial layer plus starting semiconductor. For preferred p-type substrates, the sheet resistance range is from about 200 to 500 Ω/square; the selection of the substrate resistivity and sheet resistance determines the size of the substrate resistance.

FIG. 1 further shows a second diode 150 with its second cathode 151 tied to the first cathode 112 of first diode 110 and to first drain 123 of first MOS transistor 120. The second anode 152 is connected to ground. While the electrical potential at pin 101 keeps rising in a positive discharge event, diode 150 reaches reverse avalanche breakdown. Then the vertical parasitic pnp transistor 411 (see FIG. 4) turns on and elevates the potential of the local substrate 200. With the local substrate potential rising further, the parasitic npn transistor 412 turns on, which initiates the parasitic SCR (see FIG. 4).

FIG. 1 shows a third diode 155, which provides protection against negative discharge events, while the circuitry with first diode 110 provides protection against positive discharge events.

Figure 2:
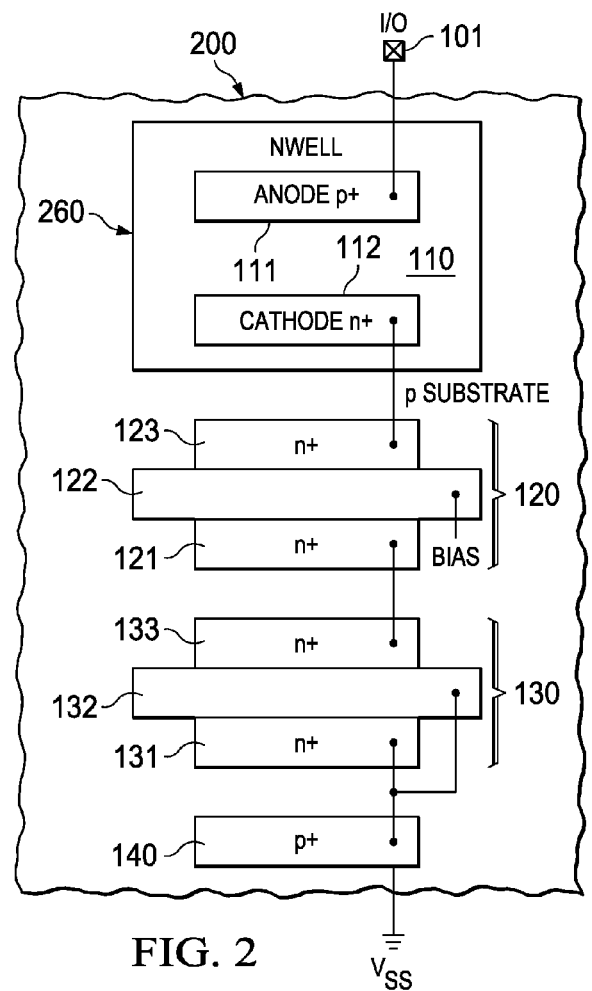
FIG. 2 illustrates a top view of an embodiment of the protection circuit of FIG. 1 in a p-type silicon substrate.

The protection circuitry of the block diagram of FIG. 1 is displayed in FIG. 2 as a schematic top view of electrical components in a semiconductor substrate. The selection of the electrical conductivities is exemplary. The p-type semiconductor substrate is designated 200 and the n-well is designated 260; I/O pad 101 with its first voltage and ground potential 140 are considered external to semiconductor substrate 200. With the substrate p-type, diode 110 is fabricated in an n-well 260, and first MOS transistors 120 and second MOS transistor 130 are nMOS transistors, preferably multi-finger transistors. The $n^+$ drain region 123 (referred to as first drain) of first transistor 120 is connected to diode cathode 112 (doped $n^+$) and the $n^+$ source region 121 (referred to as first source) of first transistor 120 is connected to the $n^+$ drain region 133 (referred to as second drain) of second transistor 130. First gate 122 can be biased to a potential (referred to as second voltage) smaller than the first voltage and is applied to reduce the first voltage of the I/O pin by the amount of the second voltage.

Figure 3:
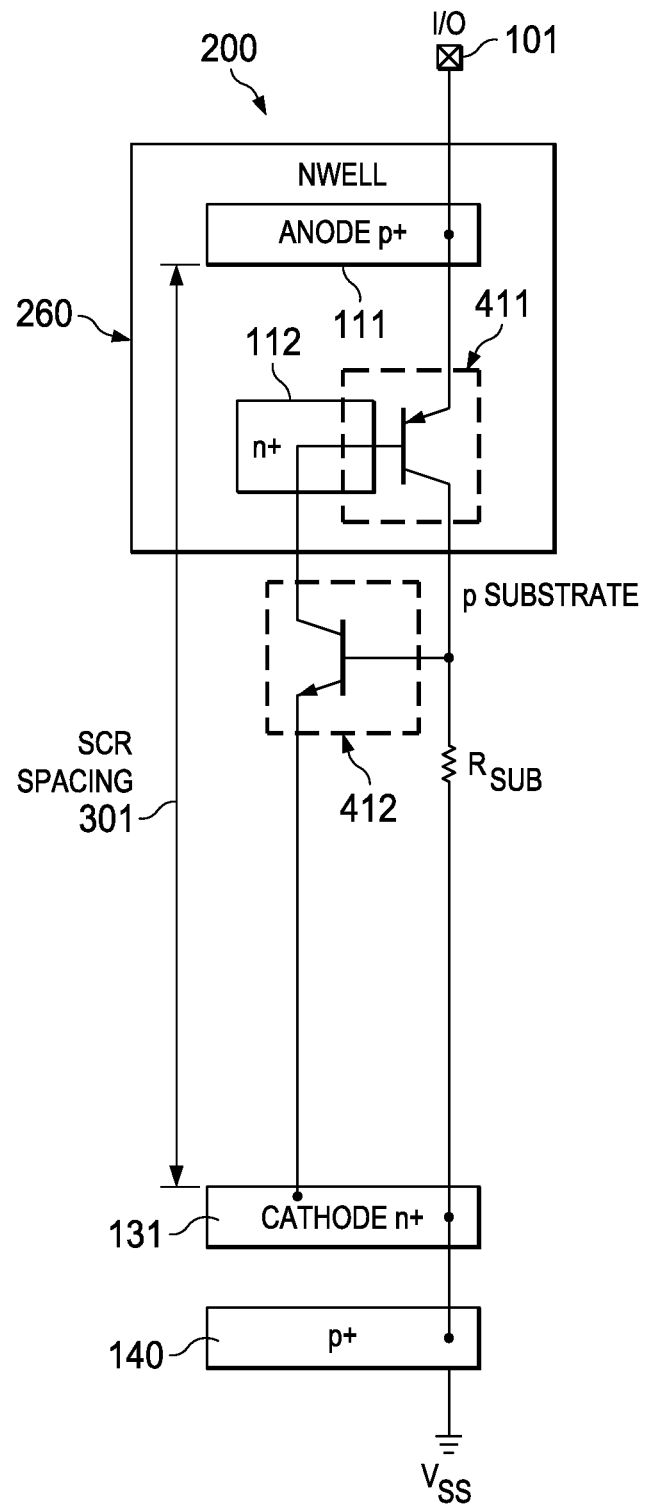
FIG. 3 depicts a hybrid top view and circuit diagram of the protection circuit in FIG. 2, emphasizing the arrangement of circuit portions determining certain protection parameters.
Figure 4:
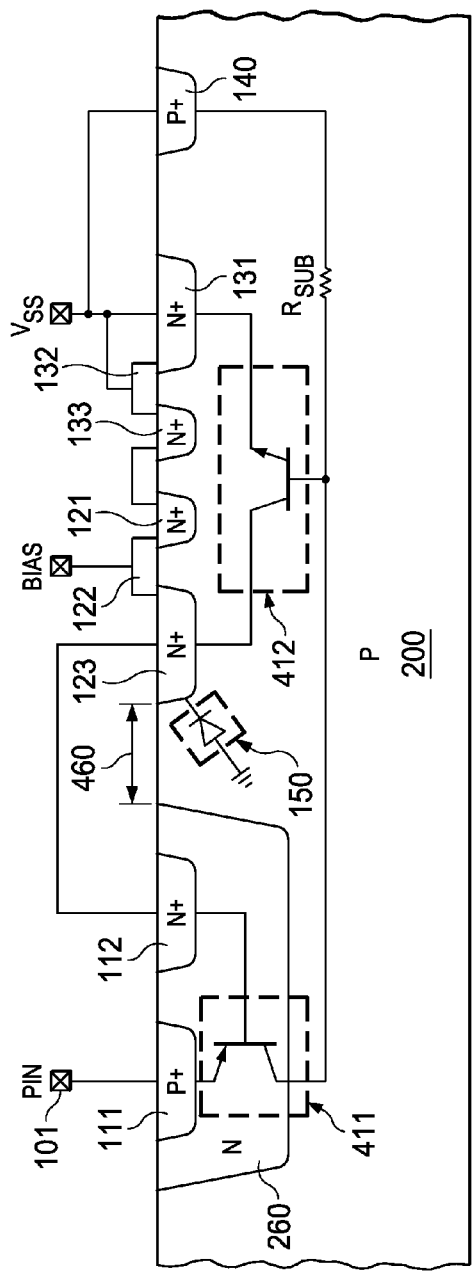
FIG. 4 shows a schematic cross section of the circuit of FIG. 2, a diode in an n-well in p-type substrate semiconductor tied in series with a first and a second nMOS transistor to facilitate the balanced formation of protective parasitic lateral bipolar transistors and a parasitic SCR for high voltage according to the invention.

The $n^+$ drain region 133 (referred to as second drain) of second transistor 130 is connected to $n^+$ source region 121 (referred to as first source) and the $n^+$ source region 131 (referred to as second source) of second transistor 130 is connected to ground potential ($V_{ss}$) 140, indicated by the $p^+$ well in the p-type substrate. The metallization of second gate 132 is also tied to ground potential. FIGS. 3 and 4 display the actions of the diode isolated grounded gate MOS structure during an ESD event.

In an ESD event, the parasitic lateral npn bipolar transistor, marked in FIG. 4 by dashed outlines, from first drain 123 to second source 131 will trigger, after diode 150 has reached reverse avalanche breakdown and parasitic pnp transistor 411 has turned on and elevated the local substrate potential. One portion of the protection relies on the mode of the parasitic bipolar transistor 412 formed by the second MOS transistor 130 to provide a low impedance current to ground; source 131 acts as an emitter, drain 123 as a collector, and the resistive substrate 200 as the base. The protection level or failure threshold (trigger current $I_Q$) can be set by varying the nMOS transistor width; the protection level thus depends on the layout style. Under stress conditions, the dominant current conduction path between the protected pin and ground involves the parasitic bipolar transistor 412 of that nMOS transistor. This parasitic bipolar transistor operates in the snapback region under pin positive with respect to ground stress events. The concept also works for drain-extended nMOS transistors. The concept has been applied to low-capacitance ESD protection where the substrate pump from the vertical pnp transistor 411 (inherent in the diode) provides uniform trigger for the MOS transistor. A transient pulse on pin 101 connected to $p^+$ node 111 activates vertical pnp transistor 411 to pump the substrate locally with holes. The pumping supports an increase of the substrate potential so that the parasitic bipolar transistor 412, formed from first drain 123 to second source 131, is turned on. In these applications, the layout of the diode in relation to the MOS transistor is arbitrary, and the diode is generally placed at some distance next to a side of the MOS layout.

Under the assumption that the complete ESD current is to be discharged through the parasitic bipolar transistor as described above, the layout of the nMOS transistor 130 can be calculated on the basis that the discharge of the 4 kV of the HBM requires an active transistor width of 400 µm based on the empirical HBM performance of 10 V/µm for a substrate-pumped transistor. Source and drain regions are designed to typically have individual widths of 40 µm; consequently, 10 gates are needed. If transistor 130 were to handle the ESD event as a substrate-pumped MOS clamp, the transistor area would result in a capacitance of about 500 fF.

In addition to the action of the parasitic bipolar transistor of the nMOS transistor for discharging an ESD current to ground, FIG. 4 illustrates a parasitic silicon controlled rectifier (SCR) action. In order for the SCR to accept a significant portion of the ESD discharge current, the n-well 260 is to be laid out so that it is positioned in proximity to the regions of the MOS transistor, preferably at the minimum distance allowed by the design rules. In FIG. 4, the close proximity is indicated by distance 460. For many protection devices, distance 460 is preferably between 1 and 5 µm. For a selected diode resistivity, the diode area is determined so that the diode on-resistance is low enough to allow sufficient current to flow through the diode to provide reliable substrate pumping for turning on the MOS transistor. Consequently, for many protection devices, the diode area is approximately a third of the MOS transistor area.

In the well 260 is at least one diode, its anode region 111 of the first conductivity type connected to I/O pad 101 and its cathode region 112 of the opposite conductivity type, connected to transistor drain 123. The layout is executed so that the diode-anode 111 is positioned in proximity to, and aligned with, the source region 122 of the MOS transistor, and the diode-cathode 112 is positioned in proximity to, and aligned with, the drain region 131.

The layout aspects are summarized in FIG. 3 by the geometrical consideration 301 referred to as SCR Spacing. The expression SCR Spacing concerns not only a geometrical distance 301, but also includes the sum of the substrate resistance $R_{sub}$ and the well resistance. The trigger voltage $V_{trig}$ of the SCR is inversely proportional to the sum of the resistances. Since a small $V_{trig}$ is desirable, as long as $V_{trig}$ remains larger than the I/O voltage at pin 101, it is preferred to keep the resistance sum, and especially at large values.

Based on the proximity layout of the transistor and diode regions and the electrical connections, a localized parasitic silicon-controlled rectifier (SCR) pnpn is created. In the schematic FIG. 8, the parasitic pnpn SCR is indicated by its pnp transistor portion 411 and its npn transistor portion 812. It comprises an SCR-anode formed by the diode-anode 111; a first base region formed by the n-well 260; a second base region formed by the p-substrate 200; and an SCR-cathode formed by the transistor source 131. The I/O pad 101 becomes the SCR-anode, and ground potential 131 (Vss) becomes the SCR-cathode. The parasitic SCR offers efficient ESD protection because it is operable to distribute an ESD current at low voltages. A further layout advantage of the embodiment of FIG. 2 is the fact that the gate 122 of MOS transistor 120 does not need a resistor to ground potential 130, since the successful ESD protection of FIG. 2 does not fully depend on an efficient npn device with additional circuit connections.

Figure 5:
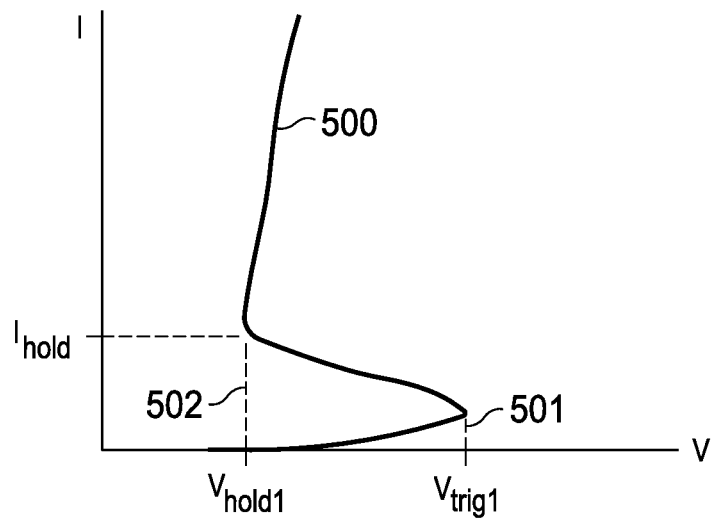
FIG. 5 displays the current-voltage characteristic of the parasitic SCR of FIG. 4.

FIG. 5 illustrates the current-voltage characteristic 500 of the parasitic SCR as created by the embodiment of FIG. 4. As mentioned, the trigger voltage $V_{trig1}$ (501) has to be greater than the first voltage applied to the I/O pin, and is inversely proportional to the sum of the substrate resistance $R_{sub}$ and n-well resistance. Since it is desirable to have a low $V_{trig}$, the resistance sum should be reasonably large, as is indeed the case in FIG. 3 based on the extended SCR spacing. On the other hand, a large sum of resistances causes a relatively high value of the SCR holding voltage $V_{hold1}$ (502), since the holding voltage is directly proportional to the SCR spacing.

Figure 8:
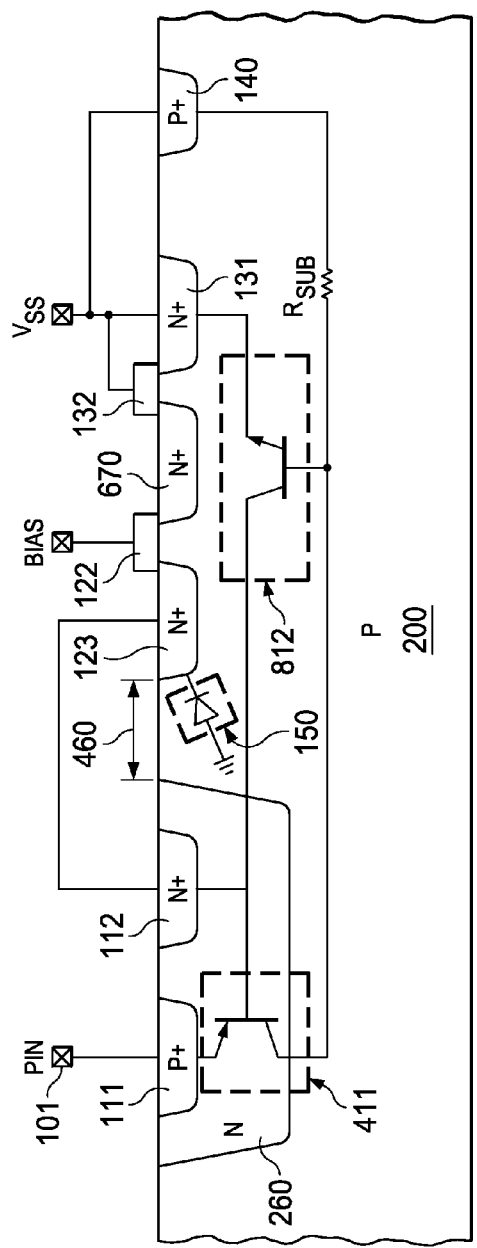
FIG. 8 shows a schematic cross section of the circuit of FIG. 6, a diode in an n-well in p-type substrate semiconductor tied in series with a first and a second nMOS transistor to facilitate the balanced formation of protective parasitic bipolar transistors and a parasitic SCR for high voltage according to the invention.
Figure 9:
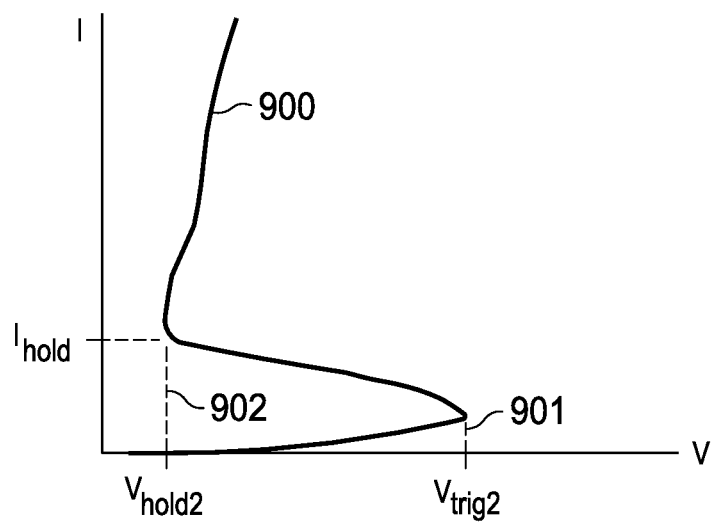
FIG. 9 displays the current-voltage characteristic of the parasitic SCR of FIG. 8.

It is preferred, however, to have a relatively low value of the SCR holding voltage for robust ESD protection and low power dissipation. Consequently, there is an effort to minimize the SCR spacing, or equivalently, to keep the sum of the substrate resistance $R_{sub}$ and n-well resistance small. The effort is described in the embodiment illustrated by FIGS. 6 to 9; the impact of this endeavor is shown in FIG. 9, which plots the current-voltage characteristic of the parasitic SCR on the same coordinates scale as in FIG. 5.

Figure 6:
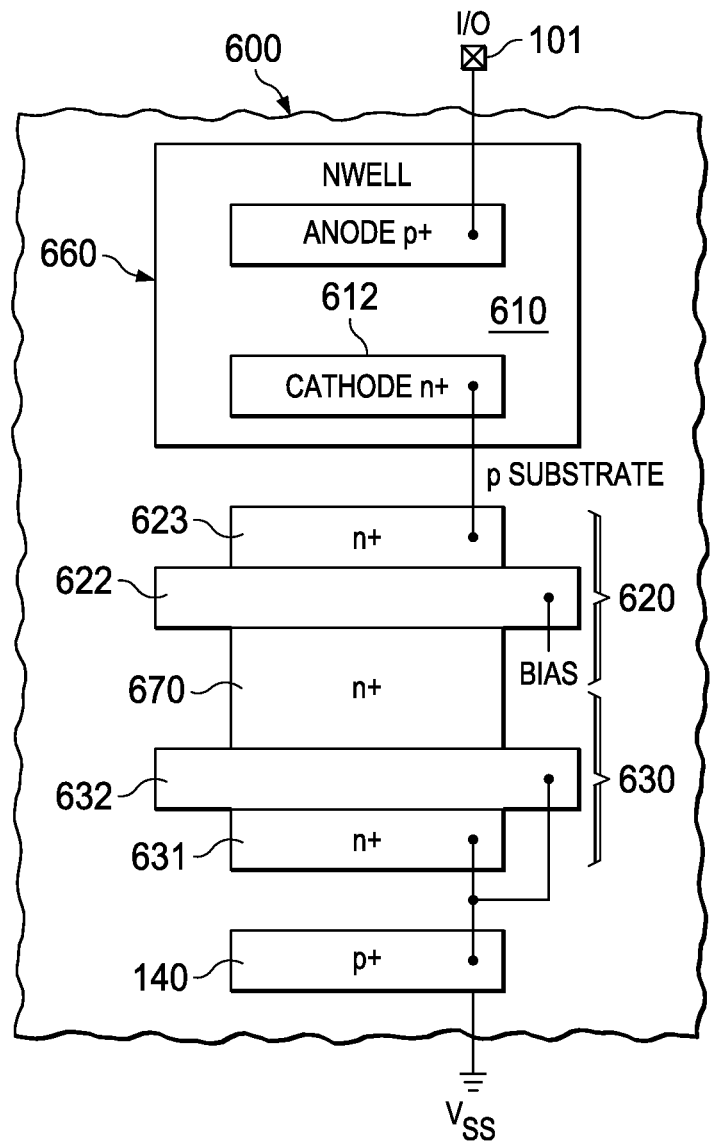
FIG. 6 illustrates a top view of another embodiment of the protection circuit of FIG. 1 in a p-type silicon substrate.

The preferred embodiment is shown in FIG. 6 as a schematic top view of the electrical components in a semiconductor substrate. Analogous to FIG. 2, the selection of the electrical conductivities in FIG. 6 is exemplary. The p-type semiconductor substrate is designated 600 and the n-well is designated 660; I/O pad 101 with its first voltage and ground potential 140 are considered external to semiconductor substrate 600. With the substrate p-type, diode 610 is fabricated in an n-well 660, and first MOS transistors 620 and second MOS transistor 630 are nMOS transistors, preferably multi-finger transistors. The $n^+$ drain region 623 (referred to as first drain) of first transistor 620 is connected to diode cathode 612 (doped $n^+$). The $n^+$ source region 621 (referred to as first source) of first transistor 620 is merged with the $n^+$ drain region 633 (referred to as second drain) of second transistor 630. The merged $n^+$ region is designated 670. First gate 622 can be biased to a potential (referred to as second voltage) smaller than the first voltage and is applied to reduce the first voltage of the I/O pin by the amount of the second voltage.

Figure 7:
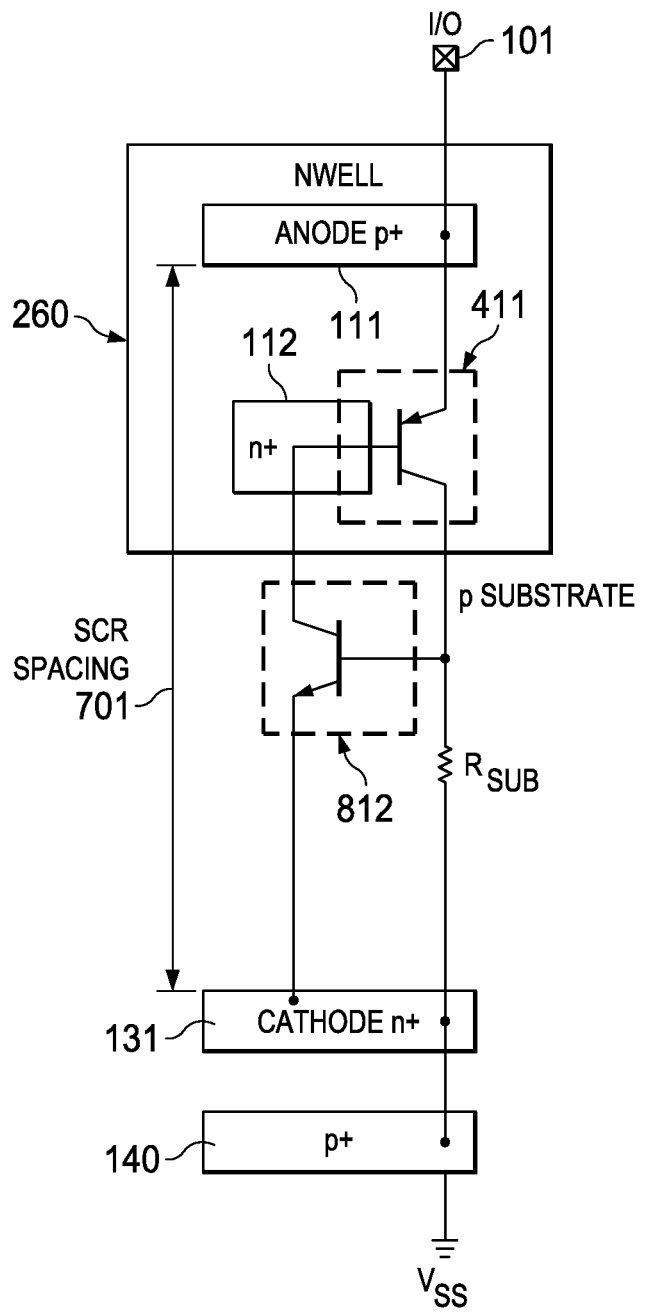
FIG. 7 depicts a hybrid top view and circuit diagram of the protection circuit in FIG. 6, emphasizing the arrangement of circuit portions determining certain protection parameters.

While the $n^+$ drain region 633 (referred to as second drain) of second transistor 630 is merged with $n^+$ source region 621 (referred to as first source) to form $n^+$ region 670, the $n^+$ source region 631 (referred to as second source) of second transistor 630 is connected to ground potential ($V_{ss}$) 140, indicated by the $p^+$ well in the p-type substrate. The metallization of second gate 632 is also tied to ground potential; the second transistor is thus not activated and does not carry current. FIGS. 7 and 8 display the actions of the diode isolated grounded gate MOS structure during an ESD event.

FIG. 8 illustrates the $n^+$ region 670 formed by merging the second drain region with the first source region. A consequence of the merging is a reduction of the geometrical distance between diode anode 111 and second source 131. This layout aspect is referred to as SCR Spacing in FIG. 7. The expression SCR Spacing concerns not only a geometrical distance 701, but also includes the sum of the substrate resistance $R_{sub}$ and the well resistance. As mentioned, the SCR holding voltage $V_{hold}$ is directly proportional the SCR spacing, the desirable low $V_{hold2}$ (902) of FIG. 9 can be achieved by the reduced SCR spacing 701. On the other hand, since the trigger voltage $V_{trig}$ of the SCR is inversely proportional to the sum of the resistances, the reduction SCR spacing may be compensated by increasing the $R_{sub}$ resistivity.

In order for the SCR to accept a significant portion of the ESD discharge current, the n-well 260 is to be laid out so that it is positioned in proximity to the regions of the first MOS transistor, preferably at the minimum distance 460 allowed by the design rules. For many protection devices, distance 460 is preferably between 1 and 5 μm. As mentioned above, for a selected diode resistivity, the diode area is determined so that the diode on-resistance is low enough to allow sufficient current to flow through the diode to provide reliable substrate pumping for turning on the MOS transistor. Consequently, for many protection devices, the diode area is approximately a third of the MOS transistor area.

Based on the proximity layout of the transistor and diode regions and the electrical connections, a localized parasitic silicon-controlled rectifier (SCR) pnpn is created. In the schematic FIG. 8, the parasitic pnpn SCR is indicated by its pnp transistor portion 411 and its npn transistor portion 812. It comprises an SCR-anode formed by the diode-anode 111; a first base region formed by the n-well 260; a second base region formed by the p-substrate 200; and an SCR-cathode formed by the transistor source 131. The I/O pin 101 becomes the SCR-anode, and ground potential 131 ($V_{ss}$) becomes the SCR-cathode. The parasitic SCR offers efficient ESD protection because it is operable to distribute an ESD current at low voltages.

FIG. 9 illustrates the current-voltage characteristic 900 of the parasitic SCR as created by the embodiment of FIG. 8. As mentioned, the trigger voltage $V_{trig2}$ (901) has to be greater than the first voltage applied to the I/O pin, and is inversely proportional to the sum of the substrate resistance $R_{sub}$ and n-well resistance. The desirable small holding voltage $V_{hold2}$ (902), which is directly proportional to the SCR spacing, is achieved by the small SCR Spacing 701 illustrated in FIG. 7; small SCR spacing is equivalent to a small sum of substrate resistance $R_{sub}$ and n-well resistance. On the other hand, since it is desirable to have a low $V_{trig}$, the resistance sum should be reasonably large, which can be achieved by high resistivity values.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the embodiments are effective in pMOS transistors as well as in nMOS transistors to create ESD protection. As another example, the substrate material may include silicon, silicon germanium, gallium arsenide, gallium nitride, and other semiconductor materials employed in manufacturing.

As yet another example, while the MOS transistor is preferably a multi-finger transistor, the concept of the invention can be applied to a methodology wherein the number of poly-fingers is reduced to control the trigger point. A MOS transistor with diode area portions positioned in proximity to its four sides may operate with fewer poly fingers while contacts, vias and metals still remain the same, resulting in higher trigger and holding voltages.

As yet another example, for system level ESD protection, where SCR action is to be avoided, the proximity spacing of the diode portions relative to the MOS transistor may be adjusted until only uniform npn conduction is achieved and the protection device functions only as a large efficient npn for substrate trigger with a relatively large holding voltage.

It is therefore intended that the appended claims encompass any such modifications or embodiments.

We claim:

1. A circuit for protecting against electrostatic discharge events, comprising:
    a semiconductor substrate of first conductivity embedding a first diode connected to a cascode including at least a first MOS transistor tied to a second MOS transistor in series;
    the first diode located in a well of opposite second conductivity, the first diode's anode tied to an I/O pin-to-be-protected at a first voltage, and the first diode's cathode connected to the first drain of the first MOS transistor;
    the first MOS transistor having its first gate connected to a bias node operable to reduce the first voltage by the amount of a second voltage; and the second MOS transistor having its second drain coupled to the first source of the first MOS transistor, and its second source, together with its second gate, tied to a ground node.

2. The circuit of claim 1 wherein the substrate further has a first resistivity so that the second source is coupled to the first drain by a substrate resistance, and the well further has a second resistivity so that the first diode's anode is tied to the first diode's cathode by a well resistance, and the first diode's anode is coupled to the second source by the sum of the substrate and well resistances.

3. The circuit of claim 1 further including a third diode having its third cathode tied to the I/O pin and its third anode connected to the ground node, thereby providing protection against negative discharge events, while the circuitry with the first diode provides protection against positive discharge events.

4. The circuit of claim 1 wherein the first drain of the first MOS transistor has a reverse breakdown voltage greater than the first voltage.

5. The circuit of claim 4 wherein a parasitic silicon-controlled-rectifier (SCR) formed between the second source and the first anode has a trigger voltage $V_{trig}$, set by the reverse breakdown of the first drain, inversely proportional to the resistance sum, and a holding voltage $V_{hold}$ directly proportional to the resistance sum.

6. The circuit of claim 5 wherein an increase of the sum of substrate and well resistances lowers $V_{trig}$, and a decrease of the sum lowers $V_{hold}$.

7. The circuit of claim 5 wherein, for given substrate and well resistivities, $V_{hold}$ is directly proportional to the SCR spacing between the second source and the first anode.

8. The circuit of claim 1 further including a merger of the contact regions of the first source and the second drain, thereby reducing the spacing between second source and first anode and thus, for given substrate resistivity, the substrate resistance and $V_{hold}$.

9. The circuit of claim 1 wherein the sum of substrate and well resistances is kept large by increasing the semiconductor resistivity, while concurrently the sum is kept small by reducing the spacing between first anode and second source.

10. The circuit of claim 1 further including one or more additional biased MOS transistors connected in series.

11. The circuit of claim 1 wherein close proximity of the contacts of first anode and first cathode minimizes the well resistance between the contacts, allowing the parasitic bipolar transistor between well and substrate to pump electrical carriers into the substrate for turning-on a parasitic silicon-controlled-rectifier constituted between first anode and second source.

12. An electrostatic discharge protection circuit, comprising:
a semiconductor substrate of first conductivity type;
a first diode located in a well of opposite second conductivity, the first diode having an anode tied to an I/O pin;
a first MOS transistor having a first drain, first source, and first gate, wherein the first gate is coupled to a bias node;
a second MOS transistor having a second drain, second source, and second gate, wherein the second drain is coupled to the first source of the first MOS transistor, and the second source, together with the second gate, are coupled to a ground node; and
the first diode having a cathode connected to the first drain of the first MOS transistor, such that the first diode is connected between the I/O pin and the first MOS transistor.

13. The circuit of claim 12, further comprising a second diode having a second cathode connected to the first drain of the first MOS transistor and a second anode connected to the ground node.

14. The circuit of claim 13, further including a third diode having a third cathode connected to the I/O pin and a third anode connected to the ground node.

* * * * *